United States Patent [19]
Fazan et al.

[11] Patent Number: 5,891,788
[45] Date of Patent: Apr. 6, 1999

[54] LOCUS ISOLATION TECHNIQUE USING HIGH PRESSURE OXIDATION (HIPOX) AND PROTECTIVE SPACERS

[75] Inventors: Pierre C. Fazan; Viju K. Mathews; Nanseng Jeng, all of Boise, Id.

[73] Assignee: Micron Technology, Inc., Boise, Id.

[21] Appl. No.: 747,797

[22] Filed: Nov. 14, 1996

[51] Int. Cl.$^6$ .................................................. H01L 21/76
[52] U.S. Cl. .............................................................. 438/439
[58] Field of Search ................................... 438/439, 229, 438/230

[56] References Cited

U.S. PATENT DOCUMENTS

| | | |
|---|---|---|
| 4,764,248 | 8/1988 | Bhattacherjee et al. . |
| 4,959,325 | 9/1990 | Lee et al. . |
| 5,087,586 | 2/1992 | Chan et al. . |
| 5,159,428 | 10/1992 | Rao et al. . |
| 5,254,494 | 10/1993 | Van Der Plas et al. . |
| 5,260,229 | 11/1993 | Hodges et al. . |
| 5,294,563 | 3/1994 | Rao . |
| 5,298,451 | 3/1994 | Rao . |
| 5,338,968 | 8/1994 | Hodges et al. . |
| 5,358,892 | 10/1994 | Rolfson . |
| 5,358,894 | 10/1994 | Fazan et al. . |
| 5,369,051 | 11/1994 | Rao et al. . |
| 5,369,052 | 11/1994 | Kenkare et al. . |
| 5,422,300 | 6/1995 | Pfiester et al. . |
| 5,470,783 | 11/1995 | Chiu et al. . |
| 5,504,034 | 4/1996 | Rapisarda . |
| 5,612,247 | 3/1997 | Itabashi . |

OTHER PUBLICATIONS

Roth, S.S. "Polysilicon Encapsulated Local Oxidation", IEEE Electron Device Letters, vol. 12, No.3, pp.92–94, Mar. 1991.

Miyoshi, H. "Selective Oxidation of Silicon in High Pressure Steam", J.Electrochem.Soc.:Solid State Science and Tech., pp. 1824–1828, Nov. 1978.

Sze, M., "VLSI Technology," 2nd Ed., pp. 121–123, McGraw Hill (1988).

Wolf, S., "Silicon Processing for the VLSI Era," vol. 3, Lattice Press, Sunset Beach, CA, pp. 362–367, 1995.

*Primary Examiner*—George Fourson
*Attorney, Agent, or Firm*—Knobbe, Martens, Olson & Bear, LLP

[57] ABSTRACT

A technique for producing an isolation structure in a semiconductor substrate wherein lateral encroachment, i.e., bird's beak formation, under a masking stack is limited. The disclosed embodiment comprises growing a layer of pad oxide on a silicon substrate and then depositing a layer of silicon nitride on the layer of pad oxide. The nitride is then patterned and etched to define a masking stack and a region of the substrate wherein the isolation structure is to be formed. The pad oxide is then removed from the region and is also partially removed under the nitride stack, thus forming a cavity. A re-ox oxide layer is then grown over the substrate, followed by the growth of a spacer layer. The spacer layer is comprised of either polysilicon or silicon nitride. Subsequently, the isolation structure is grown using high pressure oxidation techniques, which results in the oxidation structure growing sufficiently fast that the spacer layer in the cavity is not oxidized. Lateral encroachment is thus reduced and punchthrough of the bird's beak region is prevented.

17 Claims, 3 Drawing Sheets

LOCUS ISOLATION TECHNIQUE USING HIGH PRESSURE OXIDATION (HIPOX) AND PROTECTIVE SPACERS

BACKGROUND OF THE INVENTION

1. Field of the Invention

This invention generally relates to semiconductor integrated device design and fabrication and, more particularly, to the device isolation processes involving the local oxidation of silicon.

2. Description of the Related Art

The continuing trend of scaling down integrated circuits has shrunk the size of the devices on wafers to sub-half-micron dimensions and increased the circuit density to several million devices per chip. The manufacturability and reliability of these devices have recently received increasing attention. For a given chip size, an increase in the number of active circuit components requires that they be placed in close proximity to each other, thus forcing a corresponding reduction in the surface area of the circuit that can be occupied by electrical isolation structures. The trend for reducing the chip surface area consumed by electrical isolation structures, while maintaining the necessary electrical isolation of adjacent active components, has led to the development of several different isolation techniques.

The most common isolation fabrication technique is a process known as LOCOS (for LOCalized Oxidation of Silicon). In the LOCOS process, a silicon substrate is oxidized to form an isolation structure over the selected regions. These oxidized regions are known as field oxide regions and they are typically positioned so as to separate active areas of the semiconductor substrate where devices, such as transistors, will subsequently be formed.

In the conventional LOCOS technique, the process typically begins with the growth of a buffer layer, generally a thin pad oxide layer, over the substrate surface. The function of this layer is to prevent transition of stress between the silicon substrate and the subsequently deposited layers. Following this, one or more layers of masking material, typically including silicon nitride, are deposited on top of the pad oxide layer. Lithographic processes are used to define the nitride mask over active device regions of the substrate, while portions of the nitride layer are etched between the active device areas. Exposed regions of the substrate represent regions in which the field oxide (silicon dioxide) is to be thermally grown. Although the LOCOS process offers high reliability and proven high volume manufacturing compatibility, the effectiveness of this technique is limited by lateral encroachment during oxidation. The lateral oxide encroachment produces an effect commonly known as a bird's beak, the result of lateral diffusion of the oxidants under the nitride masking stack into the active device regions. The bird's beak manifests as a slowly tapering field oxide edge profile which penetrates into an adjacent usable active device area under the masking stack. As a result, the final width of the isolation structure is larger than the intended width and more of the active device regions are consumed.

These physical and electrical encroachments place severe restrictions on the use of LOCOS for ultra large scale integration (ULSI) applications. Specifically, as the device dimensions decrease to 0.5 $\mu$m, the birds's beak encroachment on either side of the masking stack can penetrate under the masking stack and even meet, thereby eliminating the active area. This extended effect of bird's beak formation is known as isolation lifting, or bird's beak punchthrough, and it imposes important limitations on device packing density for sub-half-micron and ULSI applications.

Specifically, lateral diffusion of the oxidizing species under the masking stack in LOCOS applications becomes even more pronounced as the active area dimensions are decreased. As field oxidation proceeds in ULSI applications, the concentration of the oxidizing species quickly reaches supersaturation at the locations under the masking stack, thus causing the punchthrough effect. Furthermore, the narrower masking stack used in ULSI applications also contributes to this situation, since it is stiffer and will not deform against the edge lifting that accompanies the bird's beak penetration. Accordingly, the entire masking stack will lift during the field oxidation, thereby exacerbating the punchthrough effect.

Bird's beak encroachment is the most significant drawback to conventional LOCOS processes, preventing utilization of LOCOS for deep sub-micron applications and ULSI. This problem in standard LOCOS technology has motivated the development of many advanced variations of LOCOS isolation scheme for use in smaller device applications. These advanced processes, such as PELOX, NCL, RESSFOX, PAL, and RAL, focus attention on limiting the lateral diffusion of the oxidizing species under the nitride.

In general, these processes are known as spacer LOCOS processes, since they use spacer materials (poly, nitride or combined spacers) to passivate the edges of the active areas so as to suppress the lateral diffusion of the oxidizing species during the field oxide growth. Although the bird's beak problem is reduced by using spacers, the effectiveness of known spacer processes is limited, since adding spacers closes the Si region available for oxidation and can cause severe field oxide thinning effects. Also, the problem of consumption of spacers during the oxidation severely restricts the use of known spacer processes in fabricating very dense circuits.

Hence there is a need for a technique of forming isolation structures in semiconductor substrates wherein punchthrough of the isolation structures is minimized. To this end, there is a need for a modification of the standard LOCOS processing techniques and the spacer processing techniques that would prevent the punchthrough of isolation structures in sub-micron and ULSI applications.

SUMMARY OF THE INVENTION

The aforementioned needs are satisfied by the process of the present invention. In accordance with one aspect, a preferred embodiment comprises forming a spacer between a semiconductor substrate and masking stack, and then forming an isolation structure in a region of the substrate adjacent the masking stack. The isolation structure is formed in such a manner as to inhibit extension of the isolation structure into the spacer beneath the masking stack. Most preferably, the isolation structure is formed by a high pressure oxidation. This process allows for the formation of isolation structures, and in particular oxide-based isolation structures, in ULSI and other sub-micron applications while significantly reducing the risk of punchthrough In one embodiment of the present invention, a layer of pad oxide is grown on a semiconductor substrate. Subsequently, a layer of nitride is then grown on the pad oxide. The nitride layer is then etched to define masking stacks and isolation regions of the substrate where the oxide is to be grown. Subsequently, the pad oxide is etched away from the isolation regions of the substrate and is, in fact, over etched so as to form cavities between the nitride and the surface of the substrate.

Subsequently, a layer of re-ox oxide is then grown so as to cover the surface of the substrate, including the surface of the substrate in the cavities. A layer of spacer material, which can be either polysilicon or nitride is then grown so that the cavities are completely filled. The isolation structure is then grown using high pressure oxidation techniques so that there is a high concentration of oxidizing species on the surface of the semiconductor. This results in extremely fast growth of the isolation structure. The extremely fast growth of the isolation structure, in turn, limits lateral encroachment of the isolation structure into the active areas.

Hence, the process of the preferred embodiment provides a process for growing isolation structures where punch-through of the isolation structure is prevented and lateral encroachment of the isolation structure into the active areas is otherwise limited. This process has particular advantages in ULSI and other sub-micron applications due to its ability to limit lateral encroachment. These and other objects and advantages of the present invention will become more fully apparent from the following description taken in conjunction with the accompanying drawings.

DETAILED DESCRIPTION OF THE PREFERRED EMBODIMENTS

Figure 1:
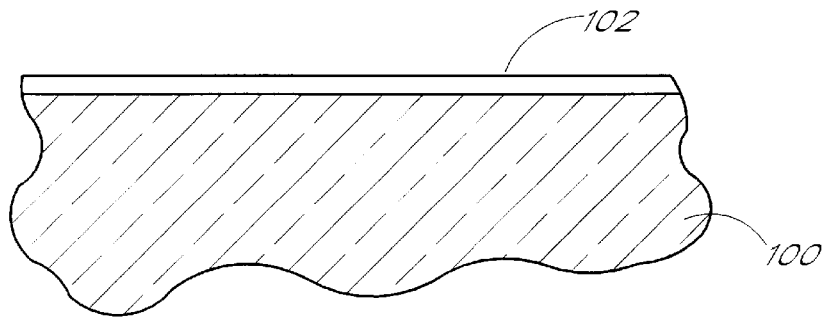
FIG. 1 is a schematic section of a semiconductor substrate having a pad oxide buffer layer grown on a first side.

Reference will now be made to the drawings wherein like numerals refer to like parts throughout. FIG. 1 illustrates a substrate 100 of a semiconductor wafer with a buffer layer 102, preferably comprising a pad oxide layer 102 positioned thereon. In the preferred embodiment, the pad oxide layer 102 is grown using a wet or dry oxidation technique and is approximately 40–300 Å thick. The pad oxide layer 102 acts as a buffer layer between subsequently deposited layers of a masking stack (described below) and the substrate wafer 100. It will be understood by one of skill in the art of field isolation that the masking material 104 may comprise additional or alternative materials, as long as the resulting layers form an effective oxygen barrier.

The "semiconductor substrate" preferably comprises a semiconductor layer, preferably a silicon structure, and particularly a monocrystalline silicon wafer. It will be understood by one having skill in this art, however, that the substrate may comprise one or more semiconductor layers or structures which include active or operable portions of semiconductor devices. Such a substrate often comprises the lowest layer of semiconductor material in a wafer, though lower layers may exist, as for integrated circuits employing silicon-on-insulator (SOI) technology.

Figure 2:
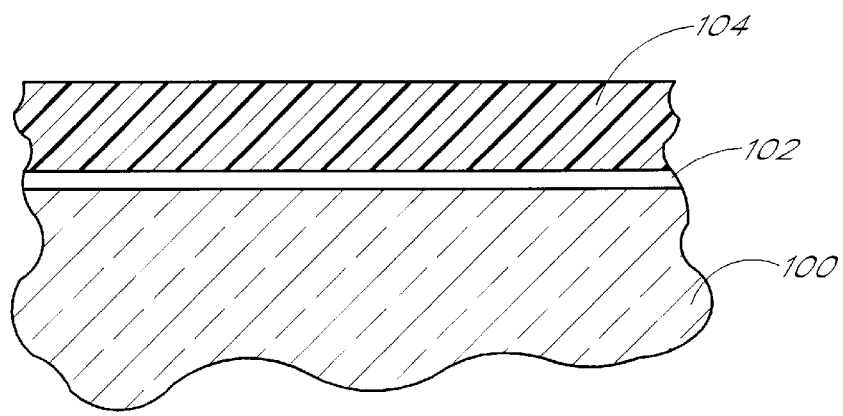
FIG. 2 is a schematic section of the semiconductor substrate shown in FIG. 1, wherein a layer of masking material has been deposited on the pad oxide layer.

FIG. 2 illustrates that a layer of masking material 104, preferably silicon nitride, is then deposited over the pad oxide layer 102. The preferred layer 104 should be approximately 1,000–3,000 Å thick. The layer of masking material 104 is somewhat impervious to oxidation and therefore inhibits the growth of oxides in portions of the substrate 100 that are covered by the masking material 104. Hence, the masking material 104 generally is positioned over regions in which devices will be formed. It will be understood that the masking material may comprises additional or alternative layers, as long as the material is resistant to a later step of growing isolation structures.

Figure 3:
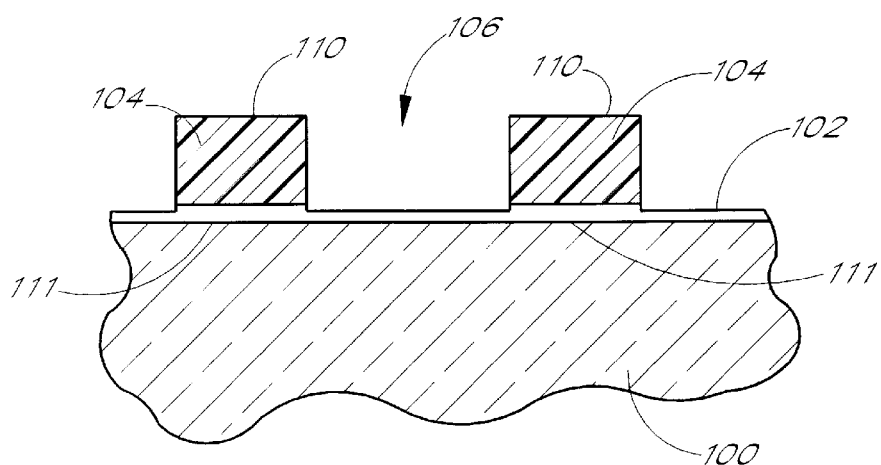
FIG. 3 is a schematic section of the substrate shown in FIG. 2, wherein the masking material has been patterned and etched to define a plurality of masking stacks.

FIG. 3 illustrates that the masking material 104 is patterned and etched so as to expose the pad oxide layer 102 over a region 106 of the substrate 100 wherein isolation structures are to be formed. The patterning and etching of the masking layer can be accomplished in any of a number of well-known manners, including conventional photolithographic and reactive ion etching processes. The patterning and etching of the masking material 104 results in the definition of one or more masking stacks 110, preferably comprising the patterned nitride layer. The masking stack 110 typically overlies an active area region 111.

Figure 4:
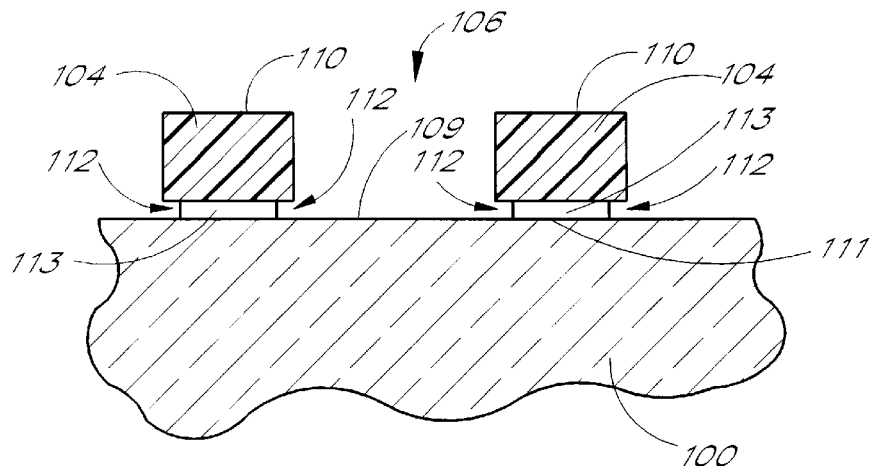
FIG. 4 is a schematic section of the substrate shown in FIG. 3, wherein the pad oxide layer has been etched so as to define cavities underneath the masking stacks.

FIG. 4 illustrates that the pad oxide layer 102 is then etched so that substantially all of the pad oxide layer 102 covering the region 106 of the substrate 100 is removed. Further, the pad oxide layer 102 is preferably over-etched so that portions of the pad oxide layer 102 underlying the masking stacks 110 are removed, thereby defining cavities 112. As illustrated, these cavities 112 form on either side of the edges of the nitride stacks 110 between an upper surface 109 of the substrate 100 and the masking material 104 of the masking stack 110. A pillar 113 of the pad oxide layer 102 remains recessed between the cavities 112.

Figure 5:
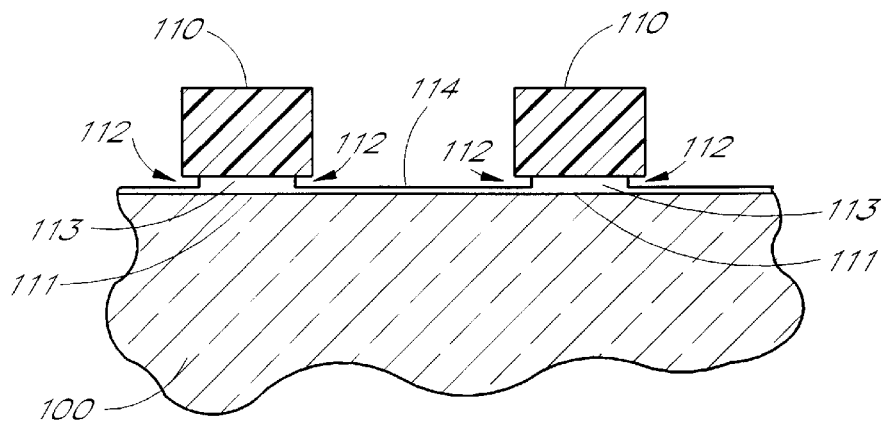
FIG. 5 is a schematic section of the substrate shown in FIG. 4, wherein a layer of re-ox oxide has been grown.

Subsequently, as shown in FIG. 5, a thin layer of re-ox oxide 114 is then grown on the surface of the silicon substrate 100. The re-ox oxide layer 114 should be on the order of 30–150 Å in thickness. The re-ox oxide layer 114 is preferably grown over the entire surface of the substrate 100 that is exposed, i.e., the region 106 of the substrate 100 and the portion of the first surface 109 of the substrate 100 that is positioned within the cavity 112.

Figure 6:
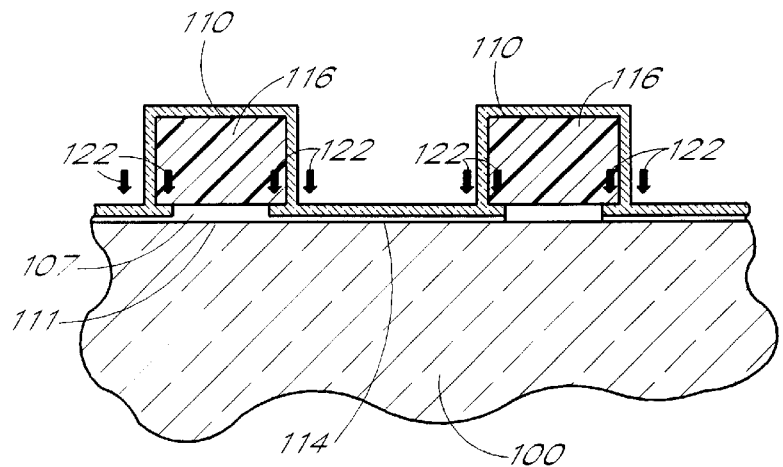
FIG. 6 is a schematic section of the substrate shown in FIG. 5, wherein a spacer layer has been deposited over the layer of re-ox oxide.

FIG. 6 illustrates a spacer layer 116 formed over the re-ox oxide layer 114. The spacer layer 116 may comprise a polysilicon layer deposited using known chemical vapor deposition (CVD) techniques. This spacer layer should be on the order of 100–600 Å thick wherein the thickness is selected so as to fill the cavity 112 and thereby seal in the recessed pillar 113 which remains of the pad oxide layer 102.

According to the process of the preferred embodiment, an oxide isolation structure 120 (FIG. 7) is now grown in the region 106 of the substrate 100. The oxide isolation structure 120 is, in the preferred embodiment, grown using a high pressure oxidation technique (HIPOX), which also results in the transformation of the polysilicon layer 116 (FIG. 6) into an oxide layer 125. The substrate 100 is preferably exposed to oxygen or water vapor in a chamber that is kept at between about 800° C. and 1200° C., more preferably between about 900° C. and 1,100° C. Chamber pressure should be maintained between about 5 Atm and 25 Atm, and more preferably between about 10 Atm and 20 Atm. This HIPOX may be maintained for less than 500 minutes, more preferably less than 200 minutes, and most preferably between about 30 and 100 minutes. The HIPOX method results in a very rapid oxidation. It will be appreciated that a spacer etch process could also be used to remove portions of the spacer layer 116 from the region 106 prior to the formation of the structure 120 to permit the structure 120 to be grown even faster. The preferred process results in little, if any, oxide growth in the cavities 112. Exposed outer portions of the polysilicon layer 116, however, may be converted to an oxide layer 125.

Figure 7:
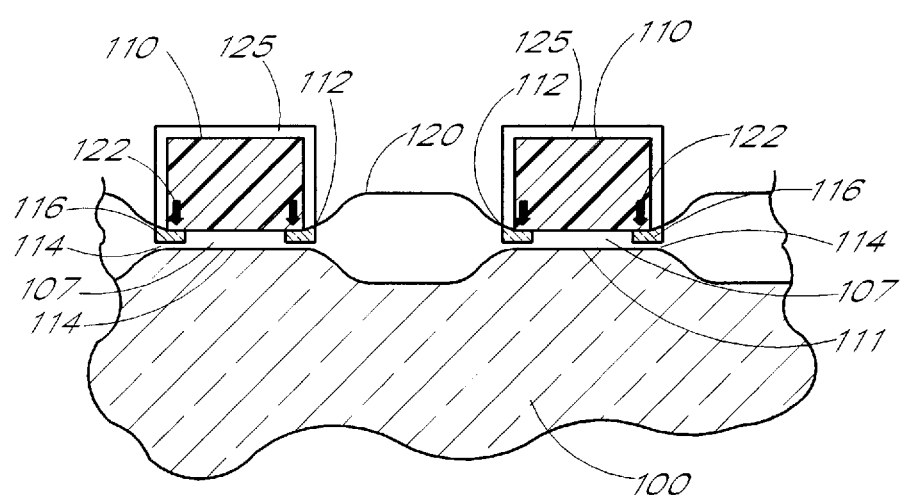
FIG. 7 is a schematic section of the substrate shown in FIG. 6, wherein an isolation structure has been grown using high pressure oxidation techniques.

The nitride of the masking stacks 110 exerts a compressive force, as represented by arrow 122 in FIG. 7, downward on the layer of spacer material 116 in the cavities 112. While oxygen molecules easily diffuse into exposed portions of the spacer layer 116, the compressive force on the spacer layer 116 within the cavities inhibits the ability of the oxygen molecules to diffuse into the cavities 112. Hence, the growth of the oxide isolation structure 120 underneath the nitride masking stacks, and in particular into the cavity 112, is limited.

Further, since high pressure oxidation techniques are used, the oxide isolation structure is grown very quickly, which further limits the lateral encroachment, i.e., bird's beak formation, underneath the nitride stack. Hence, the high pressure oxidation technique increases the concentration of oxidizing species on the upper surface 109 of the substrate 100. Further, the oxidizing species are driven into the substrate 100, which further increases the speed of growth of the isolation structure 120. Since the isolation structure 120 grows very quickly, and since the space 116 within the cavities 112 forms a barrier that inhibits lateral encroachment of the isolation structure 120, punchthrough of the bird's beak portions of the isolation structure is prevented.

The width of the active area 111 of the substrate 100, generally defined by the area underneath the masking stacks 110, is not significantly diminished by the process of the preferred embodiment, as compared to prior art processes. Hence the process of the preferred embodiment can be used to form isolation structures in applications where devices and active areas must be positioned in close proximity to one another. Thus, the process of the preferred embodiment is adaptable to sub-micron applications such as ULSI applications.

Although the foregoing description of the preferred embodiments of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention.

For example, in the preferred embodiment as described above, the spacer layer is comprised of polysilicon. However, it will be appreciated by a person skilled in the art that a CVD layer of nitride material can be deposited in the place of polysilicon, similar to known NCL processes. This would, of course, require thicker re-ox layers or thinner pad oxide layers to be grown so that the cavity 112 is completely filled by the nitride spacer layer and the re-ox oxide layer. It will be even further appreciated that other spacer techniques such as RAL, PAL and RESSFOX could also be used in conjunction with high speed growth of the isolation structures, e.g. growth using high pressure oxidation techniques, to achieve a device where the punchthrough of the isolation structures is limited. Consequently, the scope of the present invention should not be limited to the foregoing discussions, but is instead intended to be defined by the appended claims.

What is claimed is:

1. A method of forming a field oxide in a semiconductor substrate, the method comprising the steps of:
    forming a pad oxide layer on a first surface of said substrate;
    depositing a nitride layer on said pad oxide layer;
    patterning and etching said nitride layer so as to form a masking stack and so as to expose an isolation region on said first surface of said substrate;
    forming a cavity under said nitride layer by etching said pad oxide layer;
    positioning a polysilicon spacer in said cavity; and
    forming a field oxide isolation structure in said isolation region of said substrate adjacent said masking stack, wherein said isolation structure is formed by oxidizing the isolation region at a pressure greater than 1 Atm and wherein the polysilicon spacer prevents oxidation of the active area under the masking stack during the formation of the field oxide isolation structure during said growing step.

2. The method of claim 1, wherein the step of positioning said polysilicon spacer in said cavity comprises forming a polysilicon layer to a thickness sufficient to form a barrier completely isolating a remaining pillar of said pad oxide layer from said isolation structure during growth of said isolation structure, said pillar interposed between said masking stack and said first surface of said substrate.

3. The method of claim 1, wherein said step of forming said field oxide region is performed using a high pressure oxidation (HIPOX) technique performed at pressures within a range of 10–20 Atm.

4. The method of claim 3, wherein said high pressure oxidation HIPOX technique comprises exposing said substrate to an oxidizing agent at between about 900° C. and 1,100° C. under about 5 to 25 Atm of pressure.

5. A method of forming an isolation structure in a semiconductor substrate, the method comprising the steps of:
    forming a layer of buffer material on a first surface of said semiconductor substrate;
    depositing a layer of masking material over said layer of buffer material;
    patterning and etching said layer of masking material to form at least one masking stack, said masking stack overlying an active area of said substrate and defining an isolation region of said substrate;
    forming a cavity between said first surface of said semiconductor substrate and a bottom surface of said masking stack;
    filling said cavity with a polysilicon spacer layer; and
    oxidizing the resulting structure using a high pressure oxidation (HIPOX) technique which is performed at a pressure greater than 1 Atm subsequent to filling said cavity, thereby growing a field oxide isolation structure wherein said isolation structure is formed to a first size using the high pressure oxidation (HIPOX) technique so that the polysilicon spacer inhibits oxidation of the active area.

6. The method of claim 5, wherein said step of forming a layer of buffer material comprises growing a layer of pad oxide from said first surface of said semiconductor substrate.

7. The method of claim 6, wherein the step of depositing a layer of masking material comprises depositing a layer of silicon nitride over said layer of pad oxide.

8. The method of claim 7, wherein the step of forming a cavity comprises substantially removing said layer of pad oxide in said isolation region and removing a portion of said layer of pad oxide interposed between said first surface of said semiconductor substrate and said masking stack.

9. The method of claim 8, wherein the step of filling said cavity with a spacer layer comprises depositing a layer of polysilicon over said surface of said substrate so that said layer of polysilicon is positioned within said cavity.

10. The method of claim 9, further comprising the step of grown a layer of re-ox oxide prior to depositing said layer of spacer material.

11. A method of producing an isolation structure in a semiconductor substrate, comprising the steps of:

forming a masking material over a first said substrate;

patterning said masking material, thereby defining an active area under the masking stack and further defining an isolation region, wherein said isolation structure is to be formed;

forming a cavity at the interface between said masking stack and said isolation region;

forming a polysilicon spacer in said cavity between said first surface of said substrate and said masking stack; and growing a field oxide isolation structure to a first size using a high pressure oxidation (HIPOX) technique at a pressure of greater than 1 Atm so that said isolation structure forms at a speed which substantially minimizes oxidation of said spacer and so that the polysilicon spacer prevents oxidation of an active area.

12. The method of claim 11, wherein said masking layer comprises silicon nitride and wherein said step of patterning said masking material comprises a photolithographic and etch process.

13. The method of claim 11, wherein said high pressure oxidation technique comprises exposing said region of said substrate to oxygen at greater than about 900° C. and at an atmosphere of greater than about 5 Atm.

14. The method of claim 11, wherein said masking stack exerts a force against said spacer region which inhibits diffusion of said oxidizing agent into said spacer and thereby inhibits oxidation of said spacer.

15. A method of forming an isolation structure in a semiconductor substrate within an integrated circuit wafer, the method comprising the steps of:

forming a patterned masking stack on a first surface of said wafer over an active area within said substrate;

forming a cavity at the interface between said first surface of said wafer and said masking stack;

positioning a polysilicon spacer within said cavity; and oxidizing a region of said substrate adjacent said masking stack by using a high pressure oxidation (HIPOX) technique which is performed at a pressure greater than 1 Atm so that said isolation structure grows to a first size sufficiently quickly as to prevent punchthrough from lateral encroachment of said oxidation structure into said active area, wherein said isolation structure is formed to said first size using said high pressure oxidation (HIPOX) technique so that oxidation of the polysilicon spacer is minimized and the spacer thereby inhibits oxidation of the active area.

16. The method of claim 15, wherein said step of positioning a spacer on said cavity comprises forming a layer of polysilicon over said first surface of said wafer within said cavity.

17. The method of claim 15, wherein said step of oxidizing a region of said substrate results in oxidizing a portion of said spacer layer positioned on said first surface outside of said cavity, a portion of said spacer layer positioned in said cavity remaining unoxidized and forming a barrier to lateral encroachment of said oxidation structure into said active area.

* * * * *